United States Patent [19]

Shannon et al.

[11] 3,947,707
[45] Mar. 30, 1976

[54] JFET OPTICAL SENSOR WITH CAPACITIVELY CHARGED BURIED FLOATING GATE

[75] Inventors: John Martin Shannon, Whyteleafe; John Ernest Ralph, Crawley Down; Pieter Schagen, Redhill, all of England

[73] Assignee: U.S. Philips Corporation, New York, N.Y.

[22] Filed: June 12, 1974

[21] Appl. No.: 478,609

[30] Foreign Application Priority Data
June 18, 1973 United Kingdom............... 28849/73

[52] U.S. Cl................ 307/311; 250/211 J; 313/94; 355/3 R; 357/22; 357/30; 357/31; 357/59
[51] Int. Cl.²........................................ H01L 31/00
[58] Field of Search............ 357/22, 30, 31, 41, 59; 250/211 J, 578; 307/311; 313/94; 355/3 R

[56] References Cited
UNITED STATES PATENTS

| | | | |
|---|---|---|---|
| 2,968,750 | 1/1961 | Noyce | 357/22 |
| 3,044,909 | 7/1962 | Shockley | 357/22 |
| 3,366,802 | 1/1968 | Hilbiber | 357/22 |
| 3,453,507 | 7/1969 | Archer | 357/22 |
| 3,543,032 | 11/1970 | Kazan | 357/30 |
| 3,609,441 | 9/1971 | Barrekette | 357/31 |
| 3,615,854 | 10/1971 | Aten | 357/30 |
| 3,620,832 | 11/1971 | TeVelde | 357/30 |
| 3,721,839 | 3/1973 | Shannon | 357/22 |
| 3,764,325 | 10/1973 | TeVelde | 357/30 |
| 3,773,567 | 11/1973 | Gillespie | 357/30 |

*Primary Examiner*—William D. Larkins
*Attorney, Agent, or Firm*—Frank R. Trifari; Jack Oisher

[57] ABSTRACT

An electronic solid state device comprising a layer in which the electrical conductivity is controlled by a plurality of isolated discrete regions distributed within the bulk of the layer and forming potential barriers with semi conductor material of the layer surrounding the discrete regions. Electrical charge is stored in the layer by the discrete regions and the charging is obtained by the application of a potential pulse across the discrete regions. In a preferred operational mode the charging potential is applied such that current conduction paths in the layer are blocked by the depletion regions associated with the potential barrier for applied interrogation potentials across the regions of substantially smaller magnitude than the charging pulse. The device may consist of an imaging device having high charges gain and particular embodiments described consist of an image intensifier, an imaging active photocathode and a target plate of a vidicon camera tube.

24 Claims, 20 Drawing Figures

JFET OPTICAL SENSOR WITH CAPACITIVELY CHARGED BURIED FLOATING GATE

This invention relates to solid state devices, particularly but not exclusively solid state imaging devices suitable for operation in a charge storage mode, comprising a body having a layer in which the electrical conductivity can be controlled by means of electrical charge stored locally in the layer.

In many electronic applications there exists the requirement for an element the electrical conductivity of which can be controlled by means such as electromagnetic radiation and capable of operating with a high speed of response and providing a high gain. For example, in imaging applications there exists a requirement for a photoconductive element having a high gain and high speed of response. Conventional photoconductors, such as cadmium sulphide, have a relatively high gain but a relatively slow speed of response due to the gain mechanism being dependent upon the trapping of charge carriers.

Semiconductor devices operable in a charge storage mode are known, for example as target plates of vidicon camera tubes in which an array of p-n junctions present adjacent one surface of a semiconductor plate are sequentially charged by a scanning electron beam and individually discharged during a frame interval by amounts determined in accordance with a light image incident at the opposite side of the plate. These target plates have certain advantageous properties compared with conventional photoconductive target plates but have the disadvantage that they require more complex manufacturing techniques and the presence of faulty p-n junctions cannot readily be tolerated as this leads to irregularities or white spots in the reproduced image.

Another semiconductor device suitable for operation in a charge storage mode is a junction field effect transistor (JFET) and for a description of the various configurations of a JFET when used in a charge storage mode for imaging applications reference is invited to our a prior Patent by one of us, U.S. Pat. No. 3,721,839. The JFET when used in a charge storage mode is an ideal device for imaging because in addition to providing a high speed of response it also has appreciable gain and non-destructive interrogation may be achieved either during a plurality of times in a frame interval by application of separate interrogation pulses or continuously during a frame interval by application of a constant interrogation voltage.

According to one aspect of the invention a solid state device of the type described in the preamble is characterized in that a plurality of discrete regions are embedded in the layer and are each surrounded entirely by the layer and form a rectifying junction therewith, the discrete regions being capable of storing electrical charge by applying across said regions at least temporarily a potential difference, the amount of charge thus stored and hence at least locally the conductivity of the layer being dependent upon the magnitude of the applied potential difference.

According to another aspect of the invention a solid state device of the type described in the preamble and suitable for operation in a charge storage mode and comprising a body having a layer in which a plurality of isolated discrete charge storage regions are embedded, is characterized in that the charge storage regions are formed by isolated regions, which are present in the bulk of the layer, are each surrounded entirely by the layer and each form a rectifying junction with the layer, the layer having electrode means for applying a potential for charging the regions electrically and for deriving an output signal indicative of the electrical conductivity of at least a portion of the layer and hence of the amount of charge stored in said portion.

According to a further aspect of the invention a solid state device of the type described in the preamble comprising a body having a layer in which the electrical conductivity can be influenced by electrical charge stored locally in the layer, is characterized in that the layer comprises a plurality of isolated discrete regions which are present entirely within the bulk of the layer and form rectifying junctions with the semiconductor material of the layer surrounding the discrete regions, in which on application of a suitable potential pulse across at least a portion of the layer, the discrete regions in said portion can be charged electrically so that depletion layers in the semi-conductor material of the layer surrounding the said discrete regions are formed, the layer having electrode means for applying said charging potential difference and for deriving an output signal indicative of the electrical conductivity of the portion of the layer and hence of the charge stored in said portion.

In these devices in accordance with the invention various advantages arise not only in terms of simplicity of structure but also in terms of enhanced electrical characteristics such as gain, speed of response and photosensitivity as will be described hereinafter in terms of various specific forms of the device.

The discrete regions and their distribution in the layer may be such that on applying a charging potential difference of suitable magnitude, depletion layers associated with the potential barriers and present following removal of the charging potential difference are effective in blocking electrical current conduction paths between portions of the layer when applying a potential difference between said portions which is of substantially smaller magnitude than the charging potential difference.

Dependent upon the exact form of the device and its intended use various electrode configurations may be employed. Thus in one form electrodes are present at or adjacent each of the opposite major sides of the layer for the application of the charging potential difference. These electrodes may each form ohmic connections to the layer.

When the device is of the form in which electrodes are present at or adjacent the opposite major sides of the layer for the application of the charging potential difference, these electrodes may also serve for deriving output signals indicative of the electrical conductivity in the portions of the layer therebetween as determined by the charge stored in said portions when deriving said signals. The operation of one such device having such an electrode configuration may be considered to be similar to a plurality of transverse junction field effect transistor (JFET) structures having a common source electrode and drain electrode formed by electrodes at opposite major sides of the layer and a plurality of non-contacted floating gate zones formed by the discrete regions.

In another form electrode means are present at or adjacent one major side of the layer for the application of the charging potential difference and for deriving output signals indicative of the electrical conductivity in a lateral direction of the layer in the portions of the layer therebetween as determined by the charge stored in said portions when deriving said signals. The operation of one such device having such an electrode configuration may be considered to be similar to a plurality of lateral junction field effect transistor (JFET) structures having a common source electrode and drain electrode formed by electrodes at one major side of the layer and a plurality of non-contacted floating gate zones formed by the discrete regions.

In some forms of the device the charging of the discrete regions may be achieved by the application of a potential difference between ohmic electrode connections at opposite sides of the layer. In another form, at one major side of the layer an electrode layer is present which forms a rectifying junction with the layer, the semiconductor material of the layer surrounding the discrete regions being of such a composition that the application of the charging potential difference in such manner as to bias the rectifying junction in the reverse direction causes a depletion region associated with said junction to extend into the layer and withdraws on removal of the charging potential to leave charged the discrete regions.

In a further form of the device an electrode connection is present at one major side of the layer and the opposite major side of the layer is so constructed for scanning by an electron beam for application of the charging potential difference.

In another form of the device an electrode connection is present at one major side of the layer and the opposite major side of the layer is so constructed to be contacted by a movable conductive plate for the application of the charging potential difference across the layer. Such a form of the device may be used in a charge pattern producing and transfer plate for use in an electrophotographic process.

In a further form of the device, which also may be used in a charge pattern producing and transfer plate for use in an electrophotographic process, an electrode connection is present at one major side of the layer and the opposite major side of the layer is so constructed for charging by corona discharge means for application of the charging potential difference across the layer.

A device in accordance with the invention may have various forms and operate in accordance with the selective charging and discharging of portions of the layer by externally applied means. For example one form of such a device having the charge storage and discharge capability may comprise a plurality of memory elements in which the charge condition of portions of the layer and hence the conductivity of each element is controlled by the magnitude of the charging potential difference, the charge condition being representative of stored information and read-out of the stored information being provided by externally applied electrical means. In other forms the layer is chosen to be photosensitive and of such a structure that following removal of the charging potential difference the discrete regions can be discharged by radiation absorbed in the vicinity of depletion layers associated with the potential barriers, the electrical conductivity between portions of the layer being determined by the extent of the discharge of the discrete regions in the intermediate portions of the layer.

Such a device which is photosensitive may consist of a solid state imaging device suitable for operation in a charge storage mode wherein the time taken to discharge said discrete regions is dependent upon the quantity of radiation incident in the vicinity of the barriers and such that, on the periodic application of voltage pulses each of a time duration short with respect to the time constant for the discharge of the potential barriers, output signals can be derived following the application of the charging pulses, said output signals being indicative of the radiation incident in the vicinity of the potential barriers in the interval subsequent to the application of the preceding charging pulse.

The layer comprising the discrete regions may be present in a variety of different forms. In one form the layer comprises a semiconductor region mainly of one conductivity type having a plurality of buried discrete regions of the opposite conductivity type distributed therein. The buried discrete regions of the opposite conductivity type may be formed, for example by ion implantation. In a preferred form said buried discrete regions of the opposite conductivity type are located substantially in at least one common plane extending parallel to the opposite major sides of the layer. The semiconductor material of the layer may be of a polycrystalline nature and in one form the layer is built-up of polycrystalline sub-layers in which diffusion of the discrete regions has been effected between successive deposition stages.

In another form the layer comprises a plurality of discrete regions in particulate form and randomly distributed in a host semiconductor material. In one such device the layer comprises a plurality of semiconductor particles characteristic of one conductivity type distributed in a host semiconductor material characteristic of the opposite conductivity type, for example, p-type zinc telluride distributed in a host material of n-type zinc oxide, n-type zinc oxide distributed in a host material of p-type zinc telluride, p-type copper sulphide ($Cu_2S$) in a host material of n-type cadmium sulphide, and p-type silicon grains in a host material of n-type polycrystalline silicon.

In another device the layer comprises a plurality of metal particles randomly distributed in a host semiconductor material, the metal particles forming Schottky barriers with the host semiconductor material, for example platinum or lead particles in a host material of n-type zinc oxide, and platinum particles in a host material of n-type polycrystalline silicon. In general such a layer comprising metal particles forming Schottky barriers with a host semiconductor material may be formed with metal particles of a high work function metal in combination with an n-type semiconductor material or with metal particles of a low work function metal in combination with a p-type semiconductor material.

In a further device the layer comprises a plurality of semiconductor powder grains characteristic of one conductivity type and a plurality of semiconductor powder grains characteristic of the opposite conductivity type, said grains being adhered in a binder. For example the layer may comprise p-type zinc telluride grains and n-type zinc oxide grains adhered in an organic binder, for example of styrene butadiene copolymer and available commercially as "PLIOLITE".

In yet another device the layer comprises a monograin layer of grains characteristic of one conductivity type distributed in host semiconductor grains characteristic of the opposite conductivity type, and layers of semiconductor material characteristic of the opposite conductivity type situated on the opposite major sides of the monograin layer. For example such a device may comprise a monograin layer of p-type copper sulphide grains distributed in host material consisting of n-type cadmium sulphide grains and adhered in a binder, and having n-type sputtered cadmium sulphide layers on opposite major sides of the monograin layer.

A device in accordance with the invention in one form may consist of a simple photodetector. In another form it may consist of a self-scanned device for providing a video output form of electrical signals, for example via a plurality of electrodes forming ohmic connections at one side of the layer.

In another form electroluminescent means are present in series with an electrode connection associated with the layer and when the layer is photosensitive and operable in a charge storage mode as previously referred to, the device may be constructed as a solid state image intensifier.

In a further form electron emissive means are present in series with an electrode connection associated with the layer and when the layer is photosensitive and operable in a charge storage mode as previously referred to, the device may be constructed as a solid state imaging active photocathode. The photocathode may be a transmission photocathode or a reflection photocathode.

Another device in accordance with the invention in which the layer is photosensitive and operable in a charge storage mode as previously referred to, and of such a configuration that an electrode connection is present at one major side of the layer and the opposite side of the layer is so constructed for scanning by an electron beam for application of the charging potential difference, consists of a target plate of a vidicon camera tube. In this device the electron beam is employed for depositing charge on the discrete regions and the output signals may be derived in various ways. In one form the output signals are derived for each elemental portion of the layer comprising the discrete regions simultaneously with the application of the charging potential difference by means of the electron beam. Thus the device may constitute a target plate of a vidicon camera tube in which scanning of the layer by the electron beam occurs in such manner that the output signal indicative of the radiation incident in the frame interval on an elemental portion of the layer is derived simultaneously with the recharging of the discrete regions associated with said elemental portion of the layer. However in a preferred mode the output signal is derived at a later time by means of the interrogation with an electron beam, for example, from the same source but at a lower potential with respect to the electron beam previously applied for the charging of the discrete regions. For example, the charging electron beam may be applied at a potential of 30 volts with respect of the electrode connection at the opposite major surface of the layer and the interrogation electron beam may be applied at a potential of 3 volts with respect to said electrode connection.

The use of a device in accordance with the invention as a target plate of a vidicon form of camera tube may give rise to many advantages compared with conventional target plates. In comparison with those prior art target plates whose operation depends on the bulk photoconductivity of various layers the advantage of a device in accordance with the invention is that the layer behaves as a photoconductor with high gain and a fast response. Conventional photoconductors with gain rely on charge trapping to achieve the gain and are inherently slow.

As previously indicated another form of the device in which the layer is photosensitive and operable in a charge storage mode may comprise a charge pattern producing and transfer plate for use in an electrophotographic system having charge gain, whereby at a surface of a plate-shaped body comprising the photosensitive layer a charge image is produced corresponding to an image incident on the body and for transfer to means, for example paper, whereby the image can be developed and made visible. An advantage of the use of a device in accordance with the invention for this purpose is that the gain of the system enables electrophotography to be carried out at reduced light levels compared with existing systems.

Embodiments of the invention will now be described, by way of example, with reference to the accompanying diagrammatic drawings, in which:

FIGS. 1(a) to 1(d) inclusive show in cross-section part of an electronic solid state device in accordance with the invention in the form of a simple optical detector suitable for operation in a charge storage mode, the figures also showing the circuit connections for operation of the device, and FIGS. 2(a) and 2(b) show various voltage waveforms associated in the operation of the device shown in FIG. 1;

Figure 11:
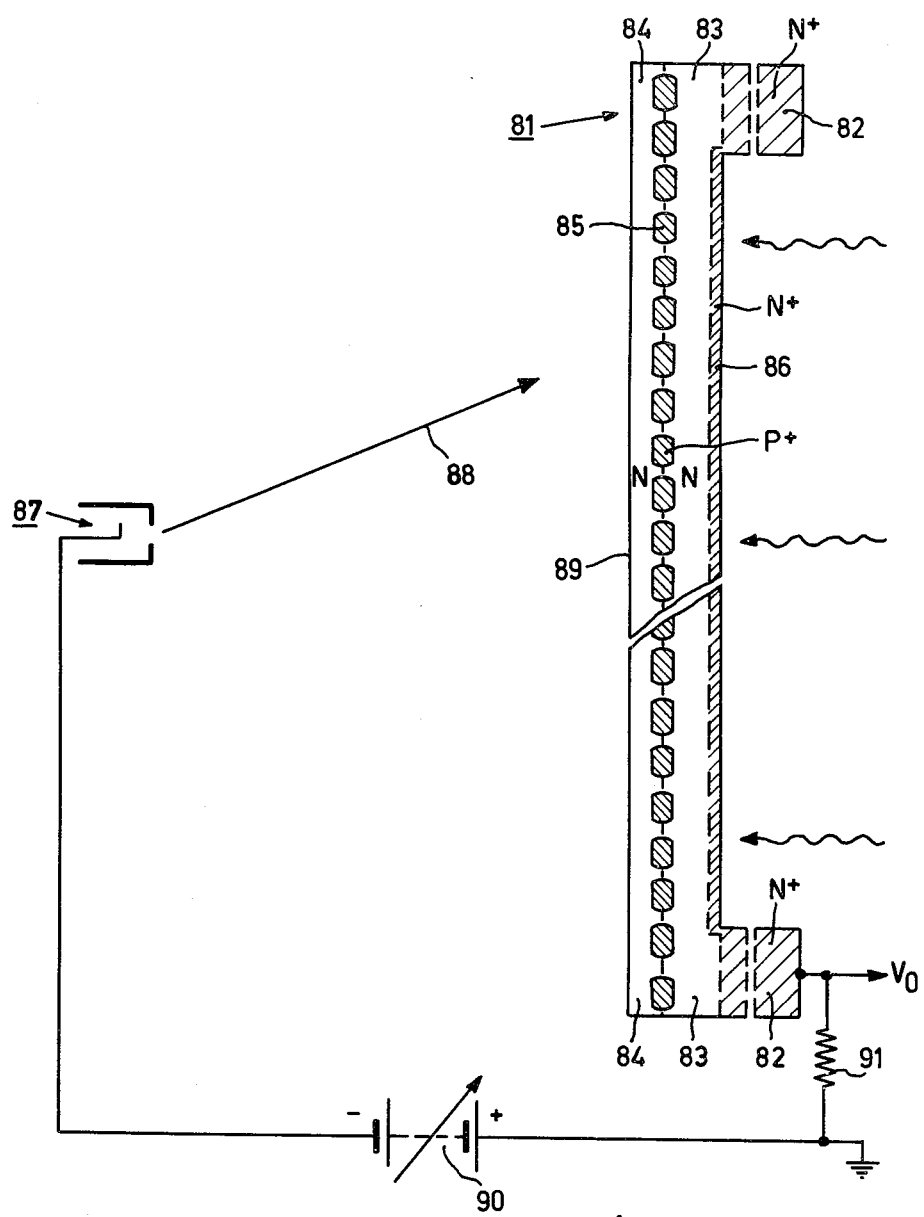

FIG. 11 shows in cross-section part of an electronic solid state device in accordance with the invention in the form of a vidicon target plate, the figure also showing the circuit connections for operation of the target plate when present in a camera tube; and FIGS. 12(a) to 12(e) inclusive show in cross-sectional views various components during successive stages in an electrophotographic process which employs an electronic solid state device in accordance with the invention in the form of a charge pattern producing and transfer plate.

Referring now to FIG. 1, there is shown part of a simple optical detector device which is operable in a charge storage mode. The device comprises a layer 1 which is formed by a mass of semiconductor material 2 having distributed therein a plurality of discrete regions 3 which form potential barriers with the semiconductor material 2 surrounding the discrete regions 3. In the present example the host semiconductor material 2 is granular n-type zinc oxide and the discrete regions 3 consist of grains of p-type zinc telluride which form a plurality of rectifying junctions with n-type zinc oxide, the granular material being adhered in an organic binder. On the opposite major surfaces of the layer 1 there are electrodes 4 and 5 consisting of tin oxide. The dimensions of the layer 1 are 10 cm × 10 cm × 5 microns thickness and in a practical embodiment the layer 1 is provided on a suitable support body. The size of the grains of zinc telluride is 1 micron and their distribution in the layer is random with a ratio of approximately 10 to 1 of zinc oxide to zinc telluride by volume.

Figure 1A:
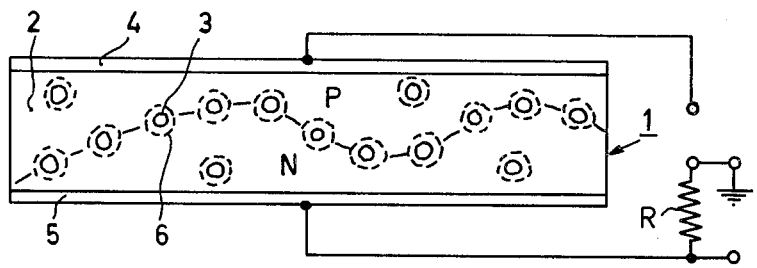

FIG. 1(a) shows the state of the layer 1 with no electrical potential applied between the electrodes 4 and 5, the grains 3 being in an equilibrium state with small depletion regions 6 associated with the rectifying junctions between the grains 3 and the semiconductor material 2 being present.

Figure 1B:
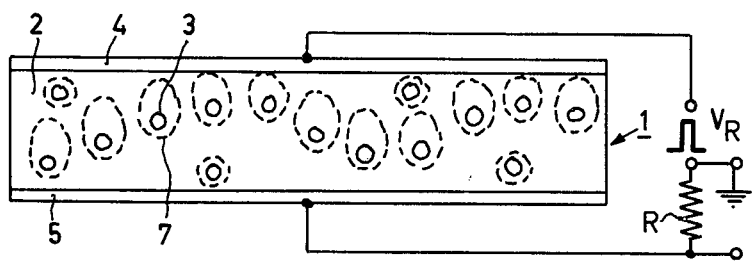

On application of a charging potential difference between the electrode layers 4 and 5, said charging potential difference being in the form of a voltage pulse $V_R$, those p-type grains which are situated in close proximity to one another become charged. The charging mechanism will now be described in terms of the p-type grains shown in the cross-sections of FIG. 1. In FIG. 1(a) a dotted line is shown between a number of p-type grains distributed in the layer in close proximity to each other. It will be clear that due to the small separation of these grains the current paths between the electrodes 4 and 5 and in the spaces between these grains will be relatively restricted and consequently on application of the voltage pulse $V_R$ a large potential difference will exist between opposite sides of the grains, that is between the opposite extremities of each grain where adjacent to the electrodes 4 and 5. Thus, due to said large difference in potential between opposite extremities of a grain, one part of the rectifying junction between the grain 3 and the semiconductor material 2 will be in a forward bias condition and the other part of the rectifying junction will be in reverse bias condition. In FIG. 1 in which the host semiconductor material is shown as n-type material and the grains distributed therein are shown as p-type grains, the following description relates to the application of the voltage pulse $V_R$ in a sense such that the electrode 4 is positive with respect to the electrode 5. In the grains situated in close proximity in the line shown the parts of the rectifying junctions between the grains 3 and the semiconductor material 2 adjacent the electrode 4 will be in reverse bias condition and the parts of said rectifying junctions adjacent the electrode 5 will be in a forward bias condition. The forward bias of the parts of the junctions adjacent the electrode 5 will cause the injection across said parts of the junctions of minority carriers into the host material 2, in this case the injection of holes into the n-type host material. In this manner negative charge is deposited on the grains and depletion layers are formed around the grains associated with the rectifying junctions. FIG. 1(b) shows the extent of the depletion regions 7 formed around the grains during application of the charging voltage pulse $V_R$, the parts of the depletion regions adjacent the electrode 4 being wider due to the parts of the rectifying junctions with which said parts of the depletion regions are associated being in a reverse bias condition.

Figure 1C:
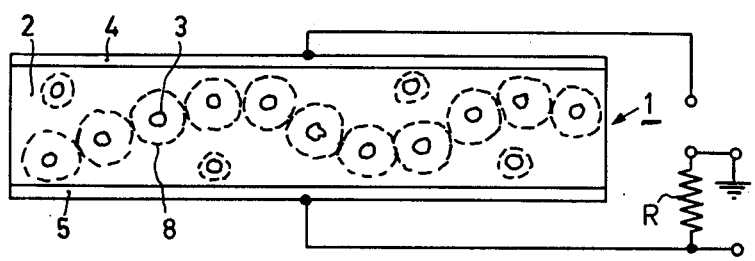

Subsequent to the application of the charging voltage pulse $V_R$, the charge is stored on the grains and is effective in supporting the depletion regions associated with the rectifying p-n junctions between the grains 3 and the host material 2. However due to the removal of the potential difference across the grains, the positive charge in the depletion regions becomes evenly redistributed around the grains and the depletion regions are thereby redistributed to be of substantially uniform extent around the grains. FIG. 1(c) shows the redistributed depletion regions 8 subsequent to the end of the application of the charging voltage pulse $V_R$, the magnitude of $V_R$ being such that the depletion regions associated with the rectifying junctions between the grains 3 in the line shown in FIG. 1(a) and the host semiconductor material 2 completely deplete the regions between adjacent grains and are effective in blocking the current paths between the electrode layers 4 and 5 when applying an interrogation potential between the electrodes 4 and 5 of substantially smaller magnitude than $V_R$. It will be further noted that the p-type grains shown lying beyond those in the line of FIG. 1(a) are shown as being charged to a lesser extent. This is due to the fact that the potential difference across these p-type grains is less than those shown in the dotted line on account of the magnitude of their larger separation from other p-type grains. It should be noted however that if $V_R$ is sufficient to force the reverse biased parts of the junctions into breakdown then other p-type grains may charge to a greater extent.

Figure 1D:
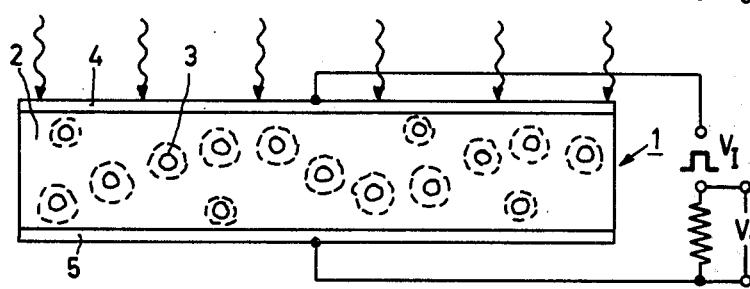
Figure 2A:
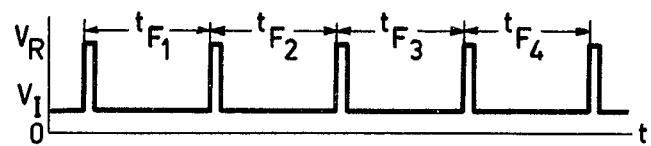
Figure 2B:

Subsequent to the application of the charging voltage pulse $V_R$, electrical signals indicative of the electrical conductivity of the layer between the electrodes 4 and 5 as determined by the charge stored in the intermediate portion of the layer can be obtained by means of applying an interrogation potential $V_I$ between the electrodes 4 and 5, the magnitude of $V_I$ being considerably less than $V_R$. In the embodiment shown the layer 1 is photosensitive and radiation is shown in FIG. 1(d) as being incident at the upper surface of the device, the electrode layer 4 allowing the passage of radiation to which the device is sensitive. Radiation which is absorbed within a depletion region or within a minority carrier diffusion length of a depletion region such as a depletion region 8 is effective, through the generation of electron-hole pairs, in causing discharge of the p-type grains and the depletion region to contract thus opening up the current paths within the n-type host material between the electrodes 4 and 5. FIG. 1(d) shows the situation where the p-type grains have been partly discharged by the incident radiation. The device can be interrogated in a non-destructive read-out manner many times subsequent to the application of the charging voltage pulse $V_R$ by applying voltage pulses $V_I$ of relatively small magnitude between the electrodes 4 and 5. The output voltage $V_O$ is measured across the resistor R. This device operates in a charge storage mode and in a radiation integrating manner in that the output signals are indicative of the radiation incident on the layer in the period following the application of the charging pulse. As an alternative to applying a series of voltage pulses $V_I$ for the interrogation a constant D.C. bias of magnitude $V_I$ may be applied between the electrodes 4 and 5. In normal operation a series of resetting charging voltage pulses $V_R$ are applied to the electrodes as a signal superimposed on a constant D.C. bias $V_I$. FIGS. 2(a) and 2(b) respectively show the input voltage waveform and the output voltage waveform associated with such a mode of operation. In a preferred form of operation the magnitude and duration of $V_R$ is chosen such that the depletion regions formed around the charged p-type grains are effective in blocking the electrical current conduction paths between the electrodes 4 and 5 for an interrogation potential of smaller manitude than $V_R$. Following application of the resetting charging potential $V_R$ the layer will integrate the free charge carriers generated by the incident radiation and the output voltage $V_O$ measured while applying the constant D.C. interrogation voltage $V_I$ is a measure of the free charge carriers generated by absorption of radiation in the depletion regions and within a minority carrier diffusion length thereof in the period following application of the resetting pulse $V_R$. FIG. 2(b) shows the output voltage $V_O$ during frame intervals $t_{F_1}$, $t_{F_2}$, $t_{F_3}$, $t_{F_4}$, etc. During frame interval $t_{F_1}$ the incident radiation intensity is high, during the frame interval $t_{F_2}$ no radiation is incident, during the frame interval $t_{F_3}$ radiation is incident but of an intensity smaller than in frame interval $t_{F_1}$, and during frame interval $t_{F_4}$ radiation is incident and of an intensity corresponding to the intensity in frame interval $t_{F_1}$. The output voltage $V_O$ rises during $t_{F_1}$ due to the integrating effect of the layer and saturates when the grains have fully discharged before falling to zero at the end of $t_{F_1}$ on application of the resetting charge potential $V_R$ to block the conduction paths between electrodes 4 and 5. As the incident radiation is absent during $t_{F_2}$ the output voltage $V_O$ remains at zero and rises again during $t_{F_3}$ when radiation is incident, the layer again integrating the free charge carriers generated during $t_{F_3}$. The value of the output voltage $V_O$ will depend upon the value of the load resistor R and the total charge passing through the load resistor R during a frame interval will be much greater than the charge displaced from the grains by the incident radiation during that interval. When R is small it is possible for the charge gain to exceed $10^4$.

The device shown in FIGS. 1(a) to 1(d) may be considered as a plurality of junction field effect transistor (JFET) structures having a common source connection formed by one of the electrode layers 4 and 5 and a common drain connection formed by the other of the electrode layers 4 and 5, the gate regions of the transistor structures being in a floating condition and formed by the grains 3 and the gate rectifying junctions being formed by the junctions between the p-type grains 3 and the n-type host semiconductor material 2. The channel regions of the JFET structures are present in the n-type host material 2 between the grains and are blocked in the previously referred to preferred mode of operation. For further description of the operation of a JFET structure as an imaging device in a charge storage mode reference is invited to U.S. Pat. No. 3,721,839.

It will be appreciated that the device shown in FIG. 1 may be modified such that radiation can be incident at the lower side of the layer 1. Furthermore an array of imaging elements can be formed by providing a plurality of electrodes at one side of the layer, the charging potential being applied between each of said plurality of electrodes and the electrode at the opposite side of the layer, for example simultaneously, and output signals being derived individually from the plurality of electrodes at the said one side of the layer.

Figure 3:
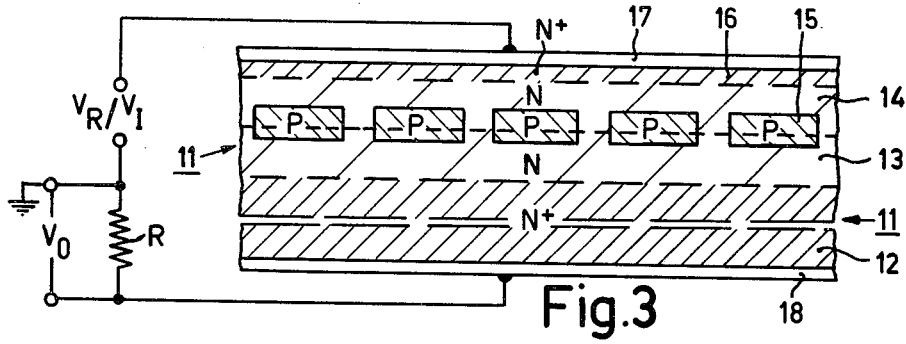
FIGS. 3 and 4 show in cross-section and plan view respectively part of a further electronic solid state device in accordance with the invention in the form of a simple optical detector or storage device suitable for operation in a charge storage mode and comprising a monocrystalline semiconductor layer, FIG. 3 also showing the circuit connections for operation of the device.
Figure 4:
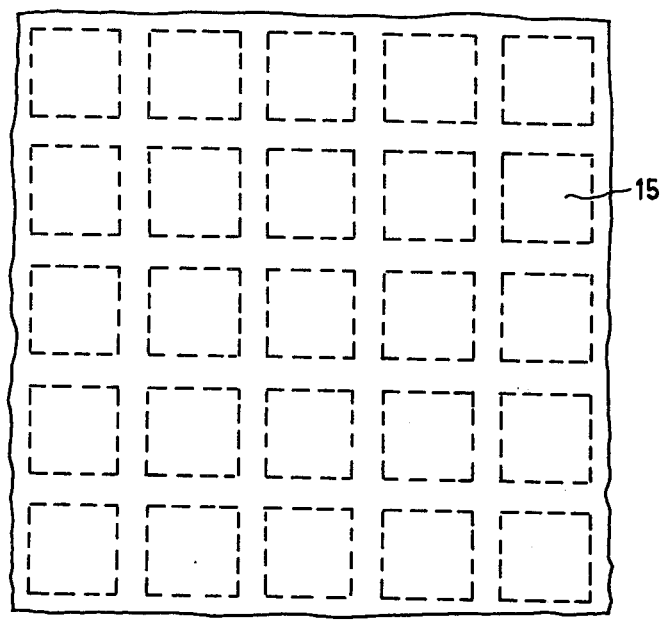

Referring now to FIGS. 3 and 4, these show in cross-section and plan view respectively a further embodiment of a simple device which may be constructed as an optical detector or information storage device which is operable in a charge storage mode. This device comprises a layer 11 of 1 mm × 1 mm cross dimensions formed by an $n^+$-silicon substrate 12 of 0.001 ohm·cm resistivity and 250 microns thickness having an n-type epitaxial layer of 10 ohm·cm resistivity and 20 microns thickness thereon. The n-type epitaxial layer is formed by first and second n-type layers 13 and 14 each of 10 microns thickness. In the vicinity of the interface between the layers 13 and 14 there is an array of p-type buried regions 15, each formed by pre-diffusion of boron into the surface of the first n-type epitaxial layer 13 prior to the deposition of the second n-type epitaxial layer 14. The p-type buried regions 15 are regularly distributed and have a surface area of 15 microns × 15 microns and a separation of 5 microns. At the surface of the second n-type epitaxial layer 14 there is an $n^+$-diffused region 16 which is contacted by an electrode layer 17 of gold. On the lower surface of the n-type substrate 12 there is an electrode layer 18 of aluminum.

The charge storage mode of operation of the device shown in FIGS. 3 and 4 is similar to the operation of the device shown in FIG. 1, the application of the charging potential difference $V_R$ being effective in charging the buried p-type regions 15 and forming depletion regions in the n-type material, which depletion regions extend in the current paths between the regions 15 and when $V_R$ is of a sufficiently large magnitude may be effective in blocking the current paths in the n-type material between the electrodes 17 and 18 when applying an interrogation potential $V_I$ of substantially smaller magnitude than $V_R$.

In the use of the device as a simple optical detector, radiation incident at the upper surface which penetrates the electrode layer 17 and is absorbed in the depletion regions or within a minority carrier diffusion length of the depletion regions will be effective in causing the depletion layers to retract thus opening up the current carrying channels. The free charge carriers thus generated in a frame interval subsequent to the application of the resetting charging potential difference are integrated and the output voltage $V_O$ may be obtained using a plurality of voltage pulses $V_I$ of substantially smaller magnitude and longer duration than $V_R$ or by applying a constant D.C. bias $V_I$ between the electrode layers 17 and 18 on which the resetting pulses $V_R$ are superimposed.

The device may also be used for information storage the amount of charge stored depending upon the magnitude of a charging setting pulse $V_R$ and if the discharge of the discrete p-type regions is due to leakage is small then the output signal $V_O$ at some time $t_i$ after applying $V_R$ is indicative of the original resetting pulse $V_R$. In this manner a device of the form shown in FIGS. 3 and 4 may be constructed as a read-only dynamic store, the electrode configuration being suitably modified, for example in such form as to provide each of a plurality of separate cells comprising 10 of the discrete p-type regions 15 with separate electrode means for the application of the resetting and interrogation potentials.

In a modification of the device shown in FIGS. 3 and 4, the n⁺-contact layer and electrode layer 16 may be replaced by a metal layer, for example of gold, which forms a Schottky barrier with the n-type silicon of the epitaxial layer 14. The application of the resetting pulse $V_R$ is then such that the Schottky barrier is reverse biased and a depletion layer is swept across the n-type layers 14 and 13 and punches-through to the p-type regions 15 and on withdrawal leaves the p-type regions 15 charged. The application of the interrogation voltage either as a series of pulses or a constant D.C. bias is then made in such manner that the Schottky barrier is biased in the forward direction. For the construction of such a device as an optical detector the Schottky barrier forming metal layer is made of such material and is of such thickness as to be able to transmit the radiation to which the device is sensitive.

In another modification the device may be constructed as an array of imaging elements each capable of yielding separate signals indicative of the radiation incident thereon. This structure may be achieved by providing an array of individually connected electrodes at the upper surface of the second epitaxial layer 14.

Figure 5:
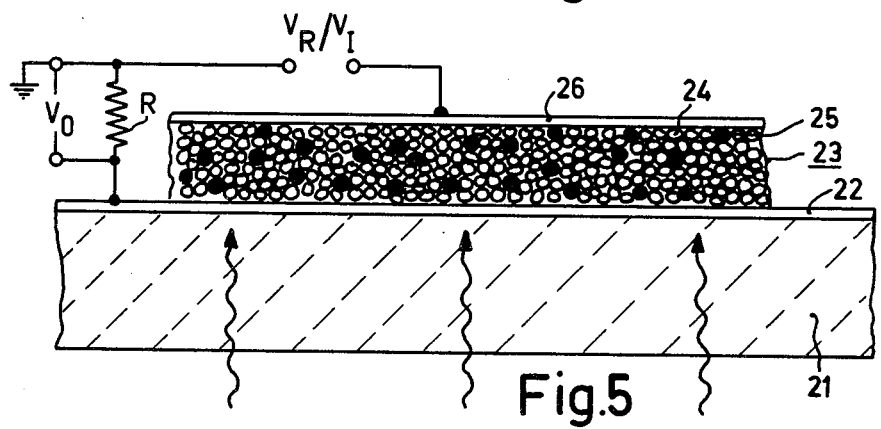
FIG. 5 shows in cross-section part of a further electronic solid state device in accordance with the invention in the form of a simple optical detector and comprising a layer of semiconductor powder grains of one and the opposite conductivity type adhered in an organic binder.

Referring now to FIG. 5 this shows in cross-section part of another embodiment of a simple optical detector device which is operable in a charge storage mode. The device comprises a substrate in the form of a glass plate 21 of 10 cm × 10 cm × 0.5 cm. On the upper surface of the glass plate 21 there is a radiation transmissive electrode layer 22 of tin oxide. On the electrode layer 22 there is composite layer 23 consisting of powder grains 24 of zinc oxide having pellets 25 of platinum randomly distributed therein and the grains 24 and pellets 25 being adhered as a composite layer of 5 microns thickness by means of an organic binder of styrene butadiene copolymer which is available commercially as "PLIOLITE". The platinum pellets 25 form Schottky barriers with the zinc oxide powder and on the upper surface of the layer 23 there is an ohmic contact electrode layer 26 of indium. The distribution ratio of platinum pellets to zinc oxide grains is approximately 10 to 1 by volume. The average size of the platinum pellets is 1 micron and the average grain size of the zinc oxide grains is 0.5 micron.

The operation of this device in a charge storage mode is similar to that described with reference to FIGS. 1 and 2 and FIGS. 3 and 4, the platinum pellets 25 being charged on application of the resetting potential difference in a manner similar to the charging of the grains 3 in the device shown in FIG. 1. The charging of the platinum pellets 25 is effective in supporting depletion regions in the zinc oxide powder material 24. The depletion regions are associated with the Schottky barriers between the platinum pellets 25 and the zinc oxide powder material 24 and retract when free charge carriers are generated by absorption of incident radiation in the layer in the depletion regions or within a minority carrier diffusion length of said depletion regions. The device shown in FIG. 5 may be modified to form an array of imaging elements by providing a plurality of electrodes at the upper surface of the layer 23. In a further modification the electrode layer 22 may be such as to form a Schottky barrier with the zinc oxide powder material and the resetting charging potential applied in such manner as to cause this Schottky barrier to be reverse biased and the depletion layer associated therewith to sweep across the layer 23 and on withdrawal to leave the platinum pellets 25 charged. The interrogation of the layer or the elements of an array is carried out with this Schottky barrier biased in the forward direction.

Figure 6:
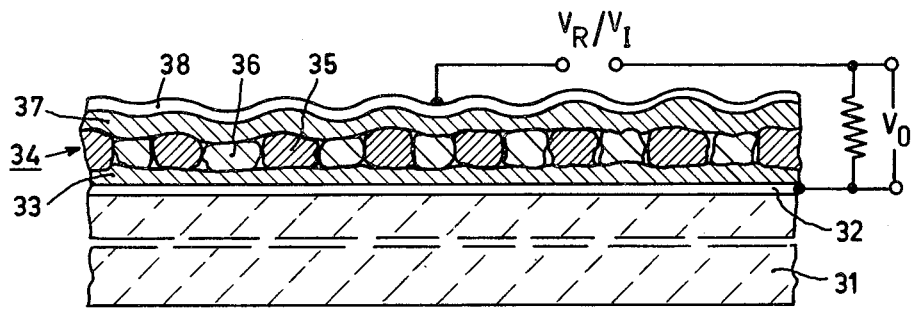
FIG. 6 shows in cross-section part of another electronic solid state device in accordance with the invention in the form of a simple optical detector and comprising a monograin layer having powder grains of one and the opposite conductivity type.

The embodiment shown in FIG. 6 consists of another simple optical detector device suitable for operation in a charge storage mode. The device comprises a glass substrate 31 having a radiation transmissive electrode layer 32 of tin oxide thereon. On the electrode layer 32 there is a layer 33 of sputtered n-type cadmium sulphide.

On the cadmium sulphide layer 33 there is a monograin layer 34 consisting of grains 35 of p-type copper sulphide randomly distributed in host grains 36 of n-type cadmium sulphide, the grains 35, 36 being adhered in an organic binder such as "PLIOLITE".

On the surface of the monograin layer 34 there is another layer 37 of sputtered n-type cadmium sulphide.

The layers 33 and 37 each form rectifying barriers with the p-type grains 35 of copper sulphide and ohmic connections with the n-type cadmium sulphide grains 36. In this manner the p-type copper sulphide grains 35 are surrounded by n-type material formed by the layers 33 and 37 of sputtered n-type cadmium sulphide and the n-type cadmium sulphide grains 36.

The operation of this device in a charge storage mode is similar to that described with reference to FIGS. 1 and 2, FIGS. 3 and 4, and FIG. 5, the p-type copper sulphide grains 36 being charged on application of the resetting potential difference $V_R$ between the electrode layers 33 and 37 in a manner similar to the charging of the grains 3 in the device shown in FIG. 1. The charging of the copper sulphide grains is effective in supporting depletion regions which extend in the n-type cadmium sulphide grains 36 in the monograin layer 34 as well as in the adjoining n-type cadmium sulphide layers 33 and 37. The magnitude of the resetting charging potential difference $V_R$ may be chosen such that the depletion regions effectively block the conduction path across the monograin layer 34 for applied potential differences of substantially smaller magnitude than $V_R$. In the operation of the device as an optical detector, radiation which is incident on the lower side of the glass plate 31 and is transmitted to the depletion regions associated with the junctions between the p-type grains 35 and the n-type grains 36 and layers 33, 37 or within a minority carrier diffusion length of said depletion regions and there absorbed causes free charge carriers to be generated and the retraction of the depletion regions. Interrogation potentials $V_I$ or a constant D.C. bias may be applied for obtaining an integrated output signal $V_O$ indicative of the incident radiation in the period following the application of the resetting potential pulse $V_R$.

Figure 7:
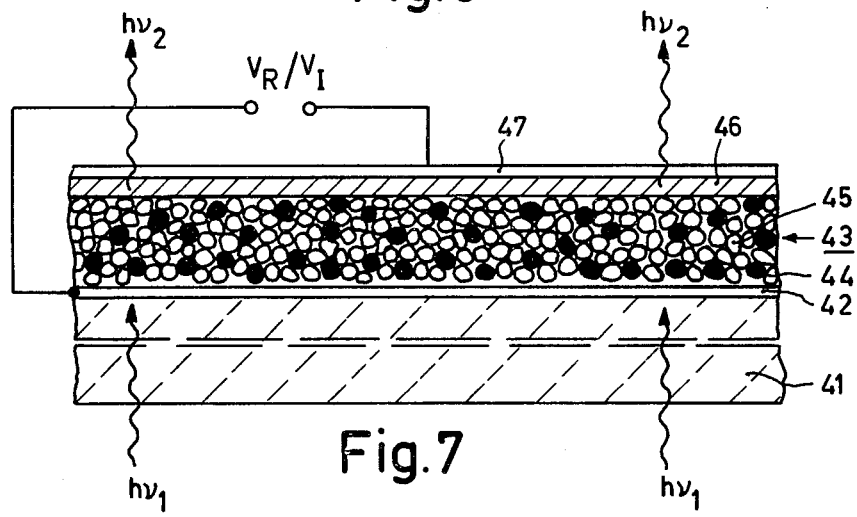
FIGS. 7 and 9 show in cross-section parts of electronic solid state devices in accordance with the invention and in the form of a solid state image intensifier comprising granular layers.

FIG. 7 shows in cross-section part of a two-terminal intensifier device which is operated in a charge storage mode. This device comprises a glass support 41 10 cm × 10 cm × 0.5 cm having a radiation transmissive electrode layer 42 of tin oxide thereon. On the electrode layer 42 there is a layer 43 of 5 microns thickness consisting of n-type zinc oxide powder grains 44 having a plurality of grains 45 of p-type zinc telluride distributed therein, the grains 44, 45 being adhered in an organic binder such as "PLIOLITE". The size of the grains 44, 45 is approximately 1 micron and the distribution of n-type zinc oxide grains 45 to p-type zinc telluride grains 44 is approximately 10 to 1 by volume. On the surface of the layer 43 there is a layer 46 of electroluminescent material consisting of copper doped zinc oxide and having a thickness of 1 micron. On the surface of the layer 46 there is a thin radiation transmissive Schottky contact electrode layer 47 of platinum.

In the operation of this device in a charge storage mode resetting charging pulses $V_R$ are applied between the electrode layers 42 and 47 to charge the p-type zinc telluride grains 45 and for applied potential differences of substantially smaller magnitude than $V_R$ to block the electrical conduction paths in the n-type zinc oxide powder material 44 between the grains 45 by the depletion regions associated with the rectifying junctions between the p-type grains 45 and the n-type zinc oxide powder material 44.

On application of an interrogation potential $V_I$ of substantially smaller magnitude than $V_R$, either as a constant D.C. bias or as a series of pulses of substantially smaller magnitude than the reset charging pulses $V_R$ and of such a polarity that the electrode layer 47 is negative with respect to the layer 42, any current flow through the layer 43 also passes through a portion of the series connected and thus reverse biased electroluminescent Schottky barrier structure comprising the layer 46 of copper doped zinc oxide and layer 47 of platinum and hence radiation will be emitted having an intensity dependent upon the current strength which in turn is dependent upon the discharge of the grains 45 produced by the free charge carriers generated by the incident radiation $h\gamma_1$. Due to the layer 43 being operated such as to provide a charge gain the intensity of the emitted radiation $h\gamma_2$ will be significantly greater than the incident radiation $h\gamma_1$ and due to the charge storage operation of the layer 43 the incident radiation $h\gamma_1$ is integrated over the frame periods between the application of the resetting charging pulses. The electroluminescent layer 46 is made thin (1 micron) to achieve a high lateral resistance and means may be present to prevent feedback of the emitted radiation to the radiation sensitive depletion regions, for example a conductive layer having a high lateral resistance and which is opaque to the radiation emitted by the layer 46 may be present between the layer 43 and the electroluminescent layer 46.

Figure 8:
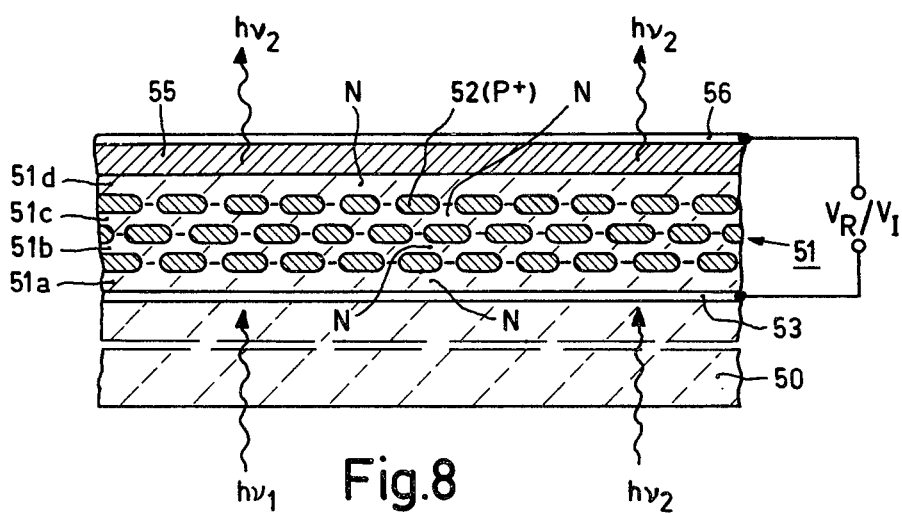
FIG. 8 shows in cross-section part of another electronic solid state device in accordance with the invention in the form of a solid state image intensifier comprising a polycrystalline semiconductor layer.

FIG. 8 shows in cross-section part of another two-terminal solid stage image intensifier device which is operated in a charge storage mode. The device comprises a glass support 50 having thereon, a semiconductor layer 51 of n-type polycrystalline silicon which is composed of four separately applied layer portions 51a, b, c, d. Between the layer 51 and the glass support 50 there is a radiation transmissive electrode layer 53 of gold of 200 A thickness. The cross-dimensions of the support 50 and layer 51 thereon are 10 cm × 10 cm. The thickness of the support 50 is 0.2 cm and the total thickness of the layer 51 is 10 microns. In the layer 51 there is a plurality of buried discrete p-type regions 52 which extend substantially in three common planes substantially parallel to the opposite major surfaces of the layer 51. The p-type regions have been provided by diffusion of boron into exposed surface portions of the polycrystalline silicon layer portions 51a, b, and c between successive stages of the deposition of the composite layer 51.

The p-type regions 52 each have cross-dimensions of 5 microns × 5 microns, a thickness of 2 microns and in the section shown the separation between adjacently situated p-type regions in the same plane is 2 microns.

On the upper surface of the layer 51 there is an electroluminescent layer 55 of zinc sulphide of 3 microns thickness. A radiation transmissive electrode layer 56 of tin oxide of 2,000 A thickness is present on the upper surface of the electroluminescent layer 55.

In the operation of this device in a charge storage mode resetting charging pulses $V_R$ are applied between the electrode layers 53 and 56 to charge the p-type regions 52 and of such magnitude that blocking of the current conduction paths between p-type regions 52 with the charge induced depletion regions associated with the p-n junctions between the p-type regions 52 and the n-type polycrystalline silicon layer 51 occurs, said current conduction paths being blocked for applied potential differences of substantially smaller magnitude than $V_R$.

On application of an interrogation potential $V_I$, either as a constant D.C. bias or as a series of pulses of substantially smaller magnitude any current flow through the layer 51 also pass through a portion of the series connected electroluminescent layer 55 of zinc sulphide and thus radiation will be emitted having an intensity dependent upon the current strength which in turn is dependent upon the discharge of the p-type regions 52 produced by the free charge carriers generated by the incident radiation which is absorbed in the depletion regions or within a minority carrier diffusion length of the depletion regions associated with the rectifying junctions between the p-type regions 52 and the n-type polycrystalline silicon layer 51. Due to the operation of the layer 51, 52 in such manner as to provide charge gain the intensity of the emitted radiation $h\gamma_2$ will be significantly greater than the intensity of the incident radiation $h\gamma_1$ and due to the charge storage mode of operation the incident radiation $h\gamma_1$ is integrated over the frame periods between the application of the reset charging pulses $V_R$.

Figure 9:
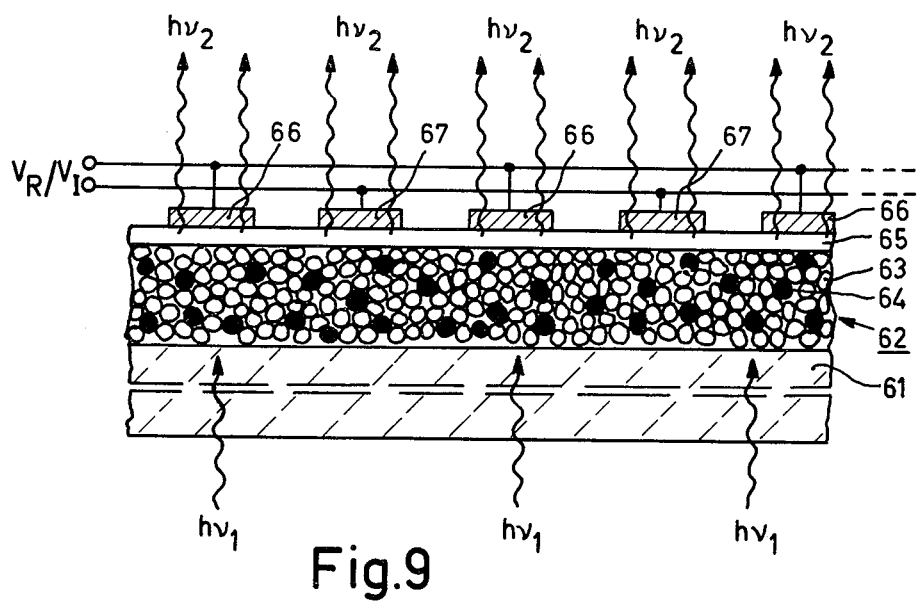

FIG. 9 shows in cross-section part of another embodiment of a two-terminal solid state image intensifier device, this embodiment having an interdigitated electrode structure. The device comprises a glass substrate 61 of 10 cm × 10 cm × 0.5 cm thickness having thereon a layer 62 of 3 microns thickness and consisting of n-type zinc oxide powder grains 63 having a plurality of p-type zinc telluride grains 64 randomly distributed therein and adhered in a binder of "PLIOLITE". On the surface of the layer 62 there is an electroluminescent layer 65 of zinc sulphide. On the surface of the electroluminescent layer 65 there is a semi-transparent interdigitated electrode pattern 66, 67 consisting of tin oxide.

The zinc oxide powder grains 63 have an average diameter of 0.5 micron and zinc telluride grains 64 also have an average diameter of 0.5 micron. The ratio of zinc oxide grains to zinc telluride grains is approximately 10 to 1 by volume.

The width of the interdigitated electrodes 66 and 67 is 100 microns and their spacing is 100 microns. In this device the electroluminescent layer 65 has a high lateral resistance and any current flow between an adjoining pair of electrodes 66, 67 takes place laterally through the layer 62. Thus in operation a resetting potential is applied as a pulse $V_R$ between the electrode pairs of 66, 67 and is of such a magnitude that the charge induced depletion regions associated with the junctions between the grains 63 and 64 render the layer 62 non-conductive in a lateral direction for applied potentials between the electrode pairs 66, 67 of a magnitude substantially less than $V_R$.

Radiation, incident from the lower side of the layer 62 and transmitted by the glass support, which is absorbed in the layer 62 in the depletion regions or with a minority carrier diffusion length of the depletion regions causes the depletion regions to retract and thus the lateral conductance of the layer increases. The interrogation potential may be applied as a series of pulses $V_I$ of smaller magnitude than $V_R$ or a constant D.C. bias $V_I$. The current between electrode pairs 66, 67 which passes through the electroluminescent layer 65 in a transverse direction will be determined by the extent of the discharge of the p-type grains 64 produced by the free charge carriers generated by the incident radiation absorbed as described, and in turn the intensity of the emitted radiation will depend on the magnitude of said transverse current through the portions of the layer 65 adjacent the electrodes 66 and 67. As in the previously described embodiment, due to the operation of the layer 62 in such manner as to provide charge gain the intensity of the emitted radiation $h\gamma_2$ will be significantly greater than the intensity of the incident radiation $h\gamma_1$ and due to the charge storage mode of operation the incident radiation $h\gamma_1$ is integrated in the frame periods between the application of the reset charging pulses $V_R$.

Figure 10:
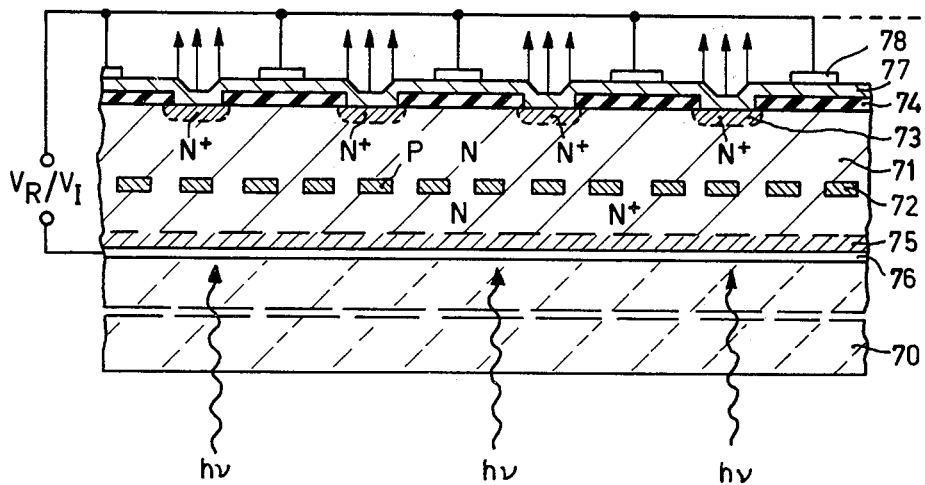
FIG. 10 shows in cross-section part of an electronic solid state device in accordance with the invention in the form of an imaging active cold cathode comprising a monocrystalline semiconductor layer.

FIG. 10 shows in cross-section part of an embodiment of an imaging solid state transmission active photocathode. The device comprises a glass plate 70 of 2.5 cm × 2.5 cm × 0.5 cm thickness having thereon an n-type semiconductor layer 71 of silicon of 2 cm × 2 cm × 15 microns thickness and 10 ohm.cm resistivity. In the layer 71 there is an array of isolated discrete buried p-type regions 72 extending in a common plane, of 3 microns × 3 microns across dimensions, 2 microns thickness and 3 microns mutual separation which have been formed by ion implantation of boron. At the upper surface of the layer 71 there are $n^+$-diffused surface regions 73 and a silicon oxide surface layer 74. At the lower surface of the layer 71 there is an $n^+$-diffused contact layer 75 and a transparent electrode layer 76 of gold. On the surface of the insulating layer 74 and in openings in the insulating layer 74 exposing the $n^+$-regions 73 there is a layer 77 of p-type silicon of 0.2 micron thickness and 0.008 ohm.cm resistivity and on the surface of the layer 77 there is a plurality of interconnected electrodes 78 consisting of parts of a metal layer of nickel. The surface of the p-type silicon layer 76 has a work function reducing coating comprising caesium and oxygen.

The device is constructed for operation in a charge storage mode wherein a resetting potential pulse $V_R$ is applied between the electrodes 76 and 78 and is effective in charging the p-type discrete regions 72. The magnitude of $V_R$ is chosen to be such that the depletion regions associated with the p-n junctions between the p-type regions 72 and the n-type layer 71 are effective in blocking the conduction path through the layer 71 between the electrodes 76 and 78 for applied potentials of substantially smaller magnitude than $V_R$. Radiation incident at the lower side of the layer 71 which is transmitted by the glass plate 70 and the electrode layer 76, on absorption in the depletion regions or within a minority carrier diffusion length of the depletion regions is effective in discharging the p-type regions 72 and thus, by the retraction of the depletion regions, opening up the conduction path across the layer 71. On application of an interrogation potential $V_I$ between the electrodes 76 and 78 either as a series of pulses or as a constant D.C. bias the current flow is determined by the state of charge of the regions 72 and $V_I$ is applied such that the electrode 78 is positive with respect to electrode 76. In this manner any current flow which occurs will comprise the injection of electrons from the $n^+$-regions 73 into the thin p-type silicon layer 77 and thus with the device placed in an evacuated enclosure under a suitable external electric field a proportion of the electrons thus injected can be caused to emerge from the coated surface of the layer 77. As is known in a semiconductor cold cathodes the distance between the injecting connection and the emissive surface must be chosen to be not substantially greater than electron diffusion length in the p-type layer and hence the thickness of the p-type silicon layer 77 is chosen accordingly. By operation of the device in a charge storage mode an imaging active photocathode is obtained having appreciable gain, a radiation pattern incident as shown at the lower side of the device being converted into an electron emission pattern as shown at the upper side of the device, the conversion being obtained with gain. Isolation between individual emissive surface parts of the p-type silicon layer 77 is achieved due to the p-type layer having a high resistivity.

In a modification of the embodiment shown in FIG. 10, the device is so constructed that a radiation pattern incident at the upper side of the device can be converted into an electron emission pattern also at the upper side of the device so that the device constitutes a so-called reflection photocathode. This may be effected by providing an n-type layer such as layer 71 as an epitaxial layer on an $n^+$-substrate without the necessity of forming a thin semiconductor body on a transmissive support such as the support 70 in the previously described embodiment.

Referring now to FIG. 11 there is shown a further embodiment of a device in accordance with the invention and consisting of a target plate 81 of a vidicon form of camera tube. The target plate consist of an n-type silicon substrate wafer 82 of 200 microns thickness and 20 ohm.cm resistivity having thereon a first n-type silicon epitaxial layer 83 of approximately 9 microns thickness and 15 ohm.cm resistivity and second n-type silicon epitaxial layer 84 of approximately 6 microns thickness and also of 15 ohm.cm resistivity. In the vicinity of the interface between the epitaxial layers 83 and 84 there is a plurality of discrete buried $p^+$-regions 85, each of substantially circular cross-section of approximately 5 microns diameter and having a spacing between adjoining peripheries of approximately 3 microns. The $p^+$-regions have a thickness of approximately 3 microns and have been formed by selective deposition and pre-diffusion of boron into the surface of the first epitaxial layer 83 prior to the deposition of the second epitaxial layer 84 and subsequent diffusion of the born therein as well as into the first epitaxial layer 83. The inner part of the substrate 82 has been etched away from the side thereof remote from the epitaxial layer 83 and the total thickness of the inner part of the target plate 81 at which a radiation pattern can be received is approximately 15 microns. An $n^+$-layer 86 of approximately 0.2 micron thickness is present at the surface of the epitaxial layer 83 exposed by the removal of the substrate material and this layer has been formed by implantation of phosphorus ions using a dose of $10^{14}$ ions/sq. cm and at an energy of 200 KeV.

The target plate is mounted in a conventional vidicon envelope which is evacuated and comprises an electron gun 87 providing an electron beam 88 which is deflected in a conventional manner by means not shown. In operation a charging electron beam is swept across the surface 89 of the target plate at a relatively high potential between the beam and the electrode connection to the n$^+$-substrate 82 and hence to the n$^+$-surface region 86 at the opposite surface of the target plate, for example 30 volts, provided by a source 90. The application of the electron beam in this manner acts to charge the buried p$^+$-regions 85 successively as the beam is swept across the surface 86. The charging mechanism is similar to that described with reference to FIG. 1 with the main difference being that instead of simultaneously charging the whole layer, in the present embodiment the charging of the p$^+$-regions 85 is sequential and according to the passage of the charging electron beam across the surface 89. The video output signal $V_o$ across a resistor 91 can be derived simultaneously with the passage of the charging beam but such a method of obtaining an output is not favoured as it fails to completely utilise the charge amplification that is inherently provided in the device structure. Thus in a preferred form of utilising the target plate 81 in the described camera tube, the application of the charging electron beam is such as to block the conduction path between opposite sides of the layer, for potentials substantially less than the charging potential, with the charge induced depletion regions associated with the p-n junctions between the p$^+$-regions 85 and the surrounding n-type material of the epitaxial layers 83 and 84. Thereafter for the reading of the charge state of the target plate 81 an electron beam is again swept across the surface 89 but at a much lower potential, for example 3 volts, and the output signals $V_o$ derived across the resistor 91. In this manner non-destructive read-out is obtained with the facility of making more than one read-out in each frame interval between application of the charging electron beam. For each elemental portion of the target plate 81 the incident radiation is integrated over the period between the application of the higher potential charging beam at the surface of the elemental portion and the application of the lower potential read-out beam at the surface of the elemental portion. Thus this device has appreciable gain in addition to a high speed of response.

It will be appreciated that the structure of the target plate may be modified in various ways. For example instead of having discrete p$^+$-regions extending in a single plane, the layer of the target plate may have discrete regions extending in a plurality of planes parallel to the opposite major sides of the plate such as are present in the embodiment shown and described with reference to FIG. 8. Moreover instead of using a monocrystalline structure with discrete buried regions formed by diffusion as described the target plate advantageously may be formed with a photosensitive layer of particulate form such as has been described with reference to FIGS. 1, 5, 7, 9. A layer in particulate form of the structure and composition as described with reference to FIG. 5 may be employed in a vidicon target plate the operation of which is similar to that described with reference to FIG. 11.

FIGS. 12(a) to 12(e) exclusive show successive stages in the use of a device in accordance with the invention and consisting of a charge pattern producing and transfer plate in an electrophotographic method. The charge pattern producing and transfer plate is of 10 cm × 10 cm × approximately 2 cm thickness and consists of a composite layer 93 of 5 microns thickness of p-type zinc telluride powder grains of 1 micron average grain size randomly distributed in n-type zinc oxide powder grains of 1 micron average grain size and adhered with an organic binder such as "PLIOLITE", the ratio of zinc telluride grains to zinc oxide grains being approximately 10 to 1 by volume and the layer being provided on a glass support plate 94 of approximately 2 cm thickness with a tin oxide contact layer 95 of 0.2 micron thickness between the glass plate 94 and the composite layer 93 the tin oxide layer forming an ohmic connection to the host n-type zinc oxide grains. In FIGS. 12(a) to 12(d) inclusive the p-type zinc telluride powder grains are shown as heavy shaded dots 96 and for the sake of clarity of illustration the n-type zinc oxide powder grains are not separately shown. In the electrophotographic making of a copy of a document the first stage in the process is to uniformly charge the layer 93 forming part of the charge pattern producing and transfer plate. This is effected by bringing a movable plate 97 of aluminum into temporary contact with the upper surface of the layer 93 and while in said contact applying a resetting potential pulse $V_R$ across the layer 93 via electrode connections to the layer formed by the movable metal plate 97 and the tin oxide layer 95 (FIG. 12(b)). In this manner the p-type zinc telluride grains 96 are charged and the value of $V_R$ is chosen such that on removal of the plate 97 the charge induced depletion regions associated with the p-n junctions between the p-type zinc telluride grains 96 and the n-type zinc oxide grains render the layer 93 nonconductive for applied potentials of substantially smaller magnitude than $V_R$. During this charging the layer 93 is preferably shielded from ambient light.

Figure 12A:
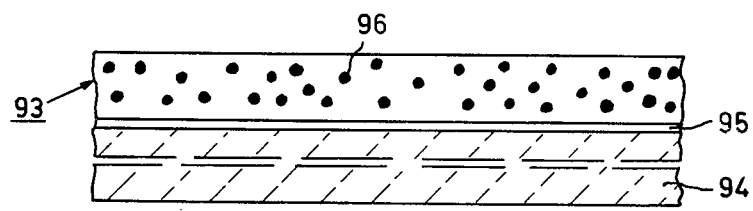
Figure 12B:
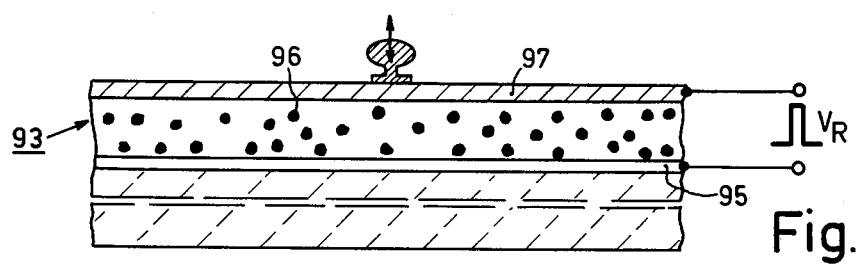
Figure 12C:
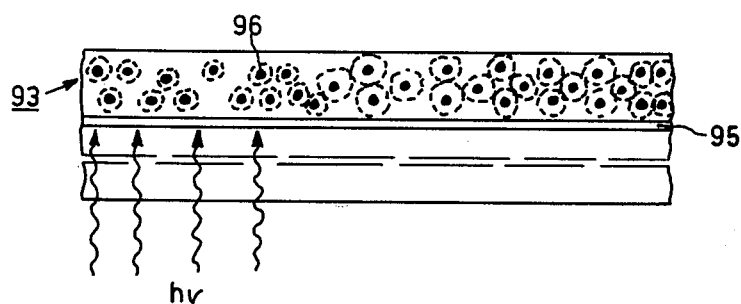
Figure 12D:
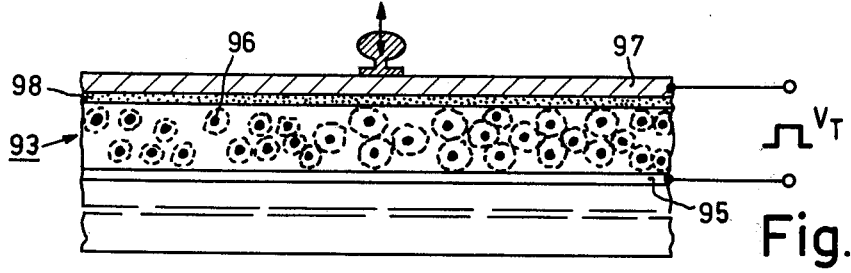
Figure 12E:

An optical image of the document to be copied is then projected onto the lower side of the glass plate 94 and is incident for a fixed period in order to selectively discharge portions of the layer 93 by amounts in accordance with the intensity of the incident light and thus leave a charge pattern in the layer 93 which is representative of the optical image (FIG. 12(c)). Thereafter a sheet of insulating paper 98 is applied to the upper exposed surface of the layer 93 and the movable plate 97 again placed on the upper surface so that the sheet of insulating paper 98 is sandwiched between the movable plate 97 and the layer 93. A transfer potential $V_T$ is then applied across the layer 93 and the sheet of insulating paper via the plate 97 and the tin oxide electrode layer 95 and in this manner charge pattern is deposited on the paper sheet 98 in accordance with the charge pattern previously produced and stored by the layer 93 (FIG. 12(d)). The potential $V_T$, which is of considerably smaller magnitude than that of the resetting potential $V_R$, is maintained for a time sufficient to give the required charge gain, that is to develop the charge image sufficiently in the next succeeding stage of the process in which, as in one conventional form of electrophotographic process, suitable toner particles 99 (FIG. 12(e)) such as carbon particles are applied to the paper sheet 98 bearing the charge pattern.

In another embodiment utilising a device in accordance with the invention of a form as shown in FIG. 12(a) the layer 93 is initially flooded at the upper surface with a corona discharge. Thereafter an optical image of the document to be reproduced is incident at the upper surface of the layer 93 and is effective in selectively discharging the layer and thus leaving a charge image pattern not only in the layer 93 but also on the surface of the layer 93. The next stage in the process is the transfer of the charge image to the sheet of paper by conventional means.

What we claim is:

1. A solid state device comprising a bulk semiconductor layer having distributed within a plurality of isolated discrete regions each forming a potential barrier with the semiconductor bulk, said discrete regions being embedded within and surrounded by the bulk semiconductor and being at floating potential, electrode means coupled to the layer, a source of charging potential, means for applying a potential pulse derived from the charging source by means of the electrode means across a portion of said layer for charging the discrete regions therein to reverse bias their barriers producing depletion zones surrounding the discrete regions, the discrete regions and potential barriers thereof being of a configuration and being distributed within the layer such that following application of a charging pulse the discrete regions remain sufficiently charged to support depletion zones in the bulk semiconductor that cause a condition of low electrical conduction through the layer portion when an interrogating voltage is applied thereto, a source of interrogating voltage, and means for interrogating the charge condition of the layer portion including means for applying a voltage derived from the interrogating source by means of the electrode means across said portion of said layer.

2. A device as claimed in claim 1 wherein the interrogating means includes means connected to the electrode means for deriving an output signal indicative of the layer portion's charge condition.

3. A solid state device as claimed claim 2 wherein the discrete regions and their distribution in the layer is such that on applying a charging potential difference of suitable magnitude, depletion zones associated with the potential barriers and present following removal of the charging potential difference are effective in blocking electrical current conduction paths between portions of the layer when applying an interrogating potential difference between said portions which is of substantially smaller magnitude than the charging potential difference.

4. A solid state device as claimed in claim 2 wherein electrodes are present adjacent each of opposite major sides of the layer for the application of the charging potential difference.

5. A solid state device as claimed in claim 4, wherein the electrodes are present at the opposite major sides of the layer and form ohmic connections to the layer.

6. A solid state device as claimed in claim 2 wherein electrode means are present adjacent only one major side of the layer for the application of the charging potential difference and for deriving output signals indicative of the electrical conductivity in a lateral direction of the layer.

7. A solid state device as claimed in claim 1 wherein at one major side of the layer an electrode layer is present which forms a rectifying junction with the layer, the semiconductor material of the layer surrounding the discrete regions being of such a composition and the application of the charging potential difference being in such manner as to bias the rectifying junction in the reverse and causes a depletion region associated with said junction to extend into the layer and withdraws on removal of the charging potential difference to leave charged the discrete regions which are influenced by the said depletion region.

8. A solid state device as claimed in claim 1 wherein an electrode connection is present at one major side of the layer and the opposite major side of the layer is so constructed for scanning by an electron beam for application of the charging potential difference across the layer.

9. A device as claimed in claim 8 wherein the device constitutes the target for an electron beam, said electron beam being utilized both for applying the charging potential and for interrogating the layer's charge condition.

10. A solid state device as claimed in claim 1 wherein an electrode connection is present at one major side of the layer and the opposite side of the layer is so constructed to be contacted by a movable conductive plate for the application of the charging potential difference across the layer.

11. A solid state device as claimed in claim 1 wherein an electrode connection is present at one major side of the layer and the opposite major side of the layer is so constructed for charging by corona discharge means for application of the charging potential difference across the layer.

12. A solid state device as claimed in claim 1 wherein the layer is photosensitive and of such a structure that following removal of the charging potential difference the discrete regions can be discharged by radiation absorbed in the vicinity of depletion zones associated with the potential barriers, the electrical conductivity between portions of the layer being determined by the extent of the discharge of the discrete regions in the intermediate portions of the layer.

13. A solid state device as claimed in claim 12 and comprising of a solid state imaging device suitable for operation in a charge storage mode wherein the time taken to discharge said discrete regions is dependent upon the quantity of radiation incident in the vicinity of the barriers and on the periodic application of voltage pulses for charging the potential barriers, each of a time duration short with respect to the time constant for the discharge of the potential barriers, output signals being derived following the application of the charging pulses, said output signals being indicative of the radiation incident in the vicinity of the potential barriers in the period subsequent to the application of the preceding charging pulse.

14. A solid state device as claimed in claim 1 wherein the layer comprises a semiconductor region mainly of one conductivity type having a plurality of buried discrete regions of the opposite conductivity type distributed therein.

15. A solid state device as claimed in claim 14, wherein said buried discrete regions of the opposite conductivity type are located substantially in at least one common plane extending parallel to opposite major sides of the layer.

16. A solid state device as claimed in claim 14 wherein the semiconductor material of the layer is of a polycrystalline nature.

17. A solid state device as claimed in claim 1 wherein the layer comprises a plurality of discrete regions in particulate form and randomly distributed in a host semiconductor material.

18. A solid state device as claimed in claim 17, wherein the layer comprises a plurality of semiconductor particles characteristic of one conductivity type randomly distributed in a host semiconductor material characteristic of the opposite conductivity type.

19. A solid state device as claimed in claim 17, wherein the layer comprises a plurality of metal particles randomly distributed in a host semiconductor material, the metal particles forming Schottky barriers with the host semiconductor material.

20. A solid state device as claimed in claim 17, wherein the layer comprises a mixture of a plurality of semiconductor powder grains characteristic of one conductivity type and a plurality of semiconductor powder grains characteristic of the opposite conductivity type adhered in a binder.

21. A solid state device as claimed in claim 1 wherein the layer comprises a monograin layer of semiconductor grains characteristic of one conductivity type distributed in host semiconductor grains characteristic of the opposite conductivity type, and layers of semiconductor material characteristic of the opposite conductivity type situated on opposite major sides of the monograin layer.

22. A solid state device as claimed in claim 1 wherein electroluminescent means are present in series with an electrode connection associated with the layer.

23. A solid state device as claimed in claim 1 wherein electron emissive means are present in series with an electrode connection associated with the layer.

24. A solid state device as claimed in claim 1 wherein the device constitutes a charge pattern producing and transfer plate for use in an electrophotographic process.

* * * * *